United States Patent [19]
Nakano et al.

[11] Patent Number: 5,585,218
[45] Date of Patent: Dec. 17, 1996

[54] PHOTORESIST COMPOSITION CONTAINING ALKYLETHERIFIED POLYVINYLPHENOL

[75] Inventors: Yuko Nakano, Ibaraki; Naoki Takeyama, Settsu; Yuji Ueda, Izumi; Takehiro Kusumoto, Takarazuka; Hiromi Oka, Takatsuki, all of Japan

[73] Assignee: Sumitomo Chemical Company, Limited, Osaka, Japan

[21] Appl. No.: 249,237

[22] Filed: May 25, 1994

[30] Foreign Application Priority Data

Jun. 2, 1993 [JP] Japan ................................. 5-131986
Mar. 3, 1994 [JP] Japan ................................. 6-033660

[51] Int. Cl.$^6$ ............................................. G03C 1/73
[52] U.S. Cl. ...................... 430/270.1; 430/325; 430/920; 430/921; 430/924
[58] Field of Search ................................. 430/270, 281, 430/325, 920, 921, 924

[56] References Cited

U.S. PATENT DOCUMENTS

| | | |
|---|---|---|
| 4,189,323 | 2/1980 | Buhr . |
| 4,258,121 | 3/1981 | Kojima ................................. 430/281 |
| 4,581,321 | 4/1986 | Stahlhofen . |
| 4,828,958 | 5/1989 | Hayase et al. . |
| 4,904,563 | 2/1990 | Aoai et al. . |
| 5,128,232 | 7/1992 | Thackeray et al. . |
| 5,208,133 | 5/1993 | Tsumori . |
| 5,227,276 | 7/1993 | Roeschert et al. . |
| 5,272,042 | 12/1993 | Allen et al. . |
| 5,273,856 | 12/1993 | Lyons et al. . |
| 5,286,600 | 2/1994 | Ochiai et al. ...................... 430/270 |
| 5,292,614 | 3/1994 | Ochiai et al. ...................... 430/270 |
| 5,403,695 | 4/1995 | Hayase et al. ...................... 430/270 |

FOREIGN PATENT DOCUMENTS

| | | |
|---|---|---|
| 1204547 | 5/1986 | Canada . |
| 2060228 | 8/1992 | Canada . |
| 0164248 | 12/1985 | European Pat. Off. . |
| 0388343 | 9/1990 | European Pat. Off. . |
| 0407086 | 1/1991 | European Pat. Off. . |
| 0419147 | 3/1991 | European Pat. Off. . |
| 0497342 | 8/1992 | European Pat. Off. . |
| 0541112 | 5/1993 | European Pat. Off. . |
| 0543761 | 5/1993 | European Pat. Off. . |
| 3325022 | 1/1985 | Germany . |
| 4228269 | 3/1993 | Germany . |
| 55-118030 | 9/1980 | Japan . |
| 1293339 | 5/1988 | Japan . |
| 63-153542 | 6/1988 | Japan . |
| 2-29752 | 1/1990 | Japan . |
| 24254 | 1/1990 | Japan . |
| 2-29751 | 1/1990 | Japan . |
| 3223862 | 10/1991 | Japan . |
| 4136858 | 5/1992 | Japan . |
| 4211258 | 8/1992 | Japan . |
| 4291261 | 10/1992 | Japan . |
| 5181277 | 7/1993 | Japan . |
| 2120263 | 11/1983 | United Kingdom . |

OTHER PUBLICATIONS

Chem. Abs. 118(14):136274e In Journal of *Photopolymer Science . . .* , vol. 3, No. 3 (1990) pp. 355–373.
In SPIE vol. 1086 "Advances in Resist Tech. and Proc . . . "(1989), pp. 2–10.

*Primary Examiner*—George F. Lesmes
*Assistant Examiner*—Laura Weiner
*Attorney, Agent, or Firm*—Birch, Stewart, Kolasch & Birch, LLP

[57] ABSTRACT

A negative or positive photoresist composition which comprises an alkali soluble resin containing at least one resin selected from the group consisting of a partially alkyletherified polyvinylphenol and a partially alkyletherified hydrogenated polyvinylphenol, a photo-induced acid precursor containing at least a kind of sulfonic acid ester of N-hydroxyimide compounds and crosslinking agent or dissolution inhibitor, and this photoresist composition is excellent in various properties such as heat resistance, film thickness retention, coating property, profile and the like, and further exhibits high sensitivity and high resolution when far ultraviolet rays including excimer laser is used as the light source. It also hardly cause a scam during the developing process.

10 Claims, No Drawings

PHOTORESIST COMPOSITION CONTAINING ALKYLETHERIFIED POLYVINYLPHENOL

The present invention relates to a resist composition particularly suitable for use in lithographies using far ultraviolet rays including excimer lasers and the like.

Recently, with an improvement in the integration level of integrated circuits, formation of lithographic patterns on the submicron order is required. Particularly, excimer laser lithography using an excimer laser as the light source is drawing attention, because it makes it possible to produce 64 and 256M DRAMs. As a result of the use of such an alternative source, the following properties have been required recently in addition to the hitherto required properties such as heat resistance, film thickness retention, profile, etc.: (1) high sensitivity to the light source mentioned above, and (2) high resolution, In view of the above-mentioned state of the art so called chemical amplification type resists utilizing an acid catalyst and a chemical amplification effect has been proposed. Using this type of resist, an acid is generated from a photo-induced acid precursor upon irradiation with light. The reaction utilizing the catalytic action of the acid thus generated changes the solubilities in the developer of the exposed part and unexposed part, and amplifies the difference between the solubilities. As its result, a positive photoresist or negative photoresist is obtained.

As the alkali-soluble resin in such chemical amplification type resists, polyvinylphenol has hitherto been widely used. The solubility of the polyvinylphenol in alkaline developer, however, is too high, and due to the high solubility, a photoresist exhibiting sufficient sensitivity and sufficient resolution cannot be obtained.

It is an object of the present invention to provide chemical amplification type negative and positive photoresist compositions exhibiting excellent sensitivity and resolution while maintaining other favorable properties of usual resists such as heat resistance, film thickness retention, coatability, profile, etc.

The present invention provides a chemical amplification type negative photoresist composition which comprises (A) an alkali soluble resin containing at least one resin selected from the group consisting of a partially alkyletherified polyvinylphenol (herein after denoted to as A1) and a partially alkyletherified hydrogenated polyvinylphenol (herein after denoted to as A2);

(B) a photo-induced acid precursor containing at least a sulfonic acid ester of N-hydroxyimide compounds; and (C) crosslinking agent.

The present invention also provides a chemical amplification type positive photoresist composition which comprises above-mentioned (A), (B) and (D) a dissolution inhibitor.

Examples of the sulfonic acid ester of N-hydroxyimide compounds include an ester represented by following formula (I):

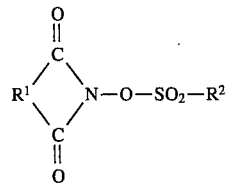

wherein $R^1$ is optionally substituted arylene, alkylene or alkenylene group and $R^2$ is optionally substituted alkyl or aryl group; and the like.

Examples of the arylene group denoted by $R^1$ in the formula (I) include monocyclic and bicyclic arylene groups, among them preferable are phenylene, naphthylene and the like. As the preferable substituent on the arylene group, halogen atom, nitro group, acetylamino group and the like can be referred to.

Examples of the alkylene group denoted by $R^1$ in the formula (I) include straight chain and branched chain alkylene groups, among which those having 1 to 6 carbon atoms are preferable and particularly preferable are ethylene, propylene and the like. As the preferable substituent on the alkylene group, halogen atom, lower alkoxy group, monocyclic aryl and the like can be referred to.

Examples of the alkenylene group denoted by $R^1$ in the formula (I) include those having 2 to 6 carbon atoms, among which vinylidene and the like are preferable. As the preferable substituent on the alkenylene group, monocyclic aryl and the like can be referred to.

Examples of the alkyl group denoted by $R^2$ in the formula (I) include straight chain and branched chain alkyl groups, among which those having 1 to 8 carbon atoms are preferable. As the preferable substituent on the alkyl group, lower alkoxy group and the like can be referred to.

Examples of the aryl group denoted by $R^2$ in the formula (I) include monocyclic and bicyclic aryl groups, among which monocyclic aryl group is preferable.

When $R^2$ is substituted alkyl or aryl group, it is preferable that its substituent is not a fluorine atom.

As examples of the sulfonic acid ester of N-hydroxyimide compounds, the following can be referred to:

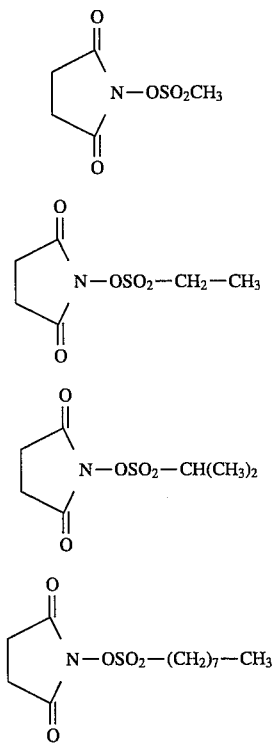

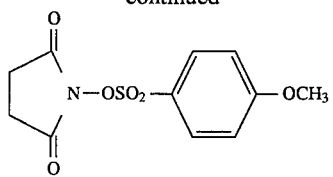
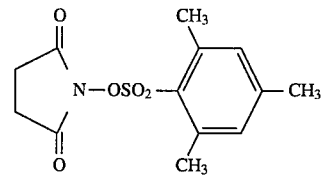
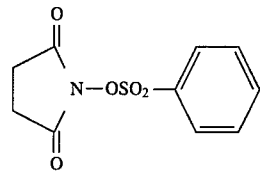
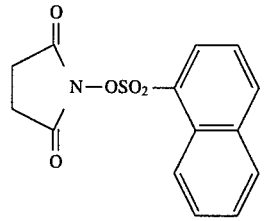
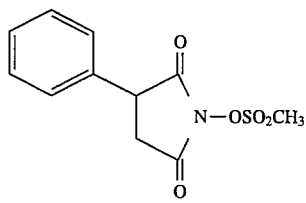
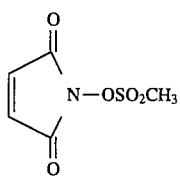
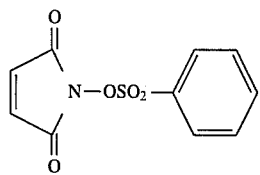
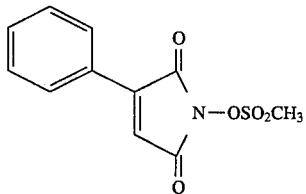
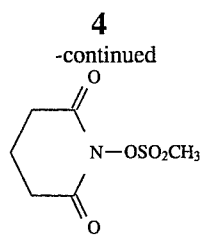
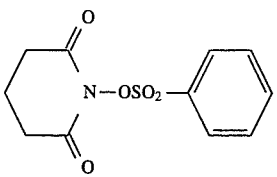
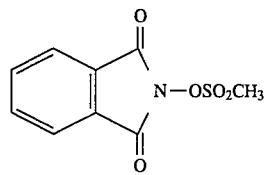
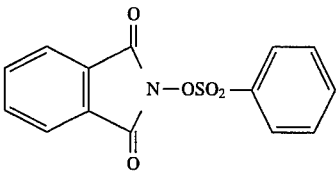
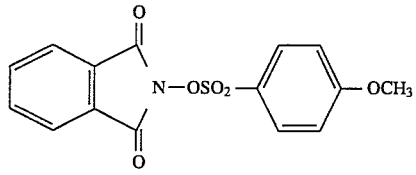
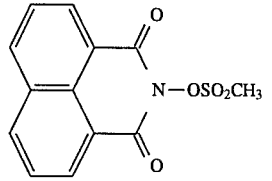
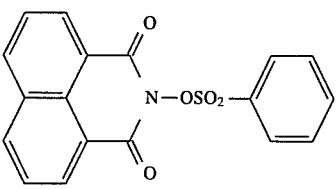
and the like.
The esters represented by the formula (I) can be produced, for example, by reacting a cyclic N-hydroxyimide compound represented by following formula
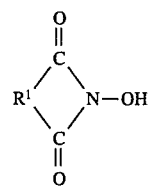
(III)

wherein $R^1$ is as defined above, which can produced according to a method described in, for example, G. F. Jaubert, Ber., 28, 360 (1985), D. E. Ames et al., J. Chem. Soc., 3518 (1955) or M. A. Stolberg et al., J. Amer. Chem. Soc., 79 2615 (1957), etc., with a sulfonyl chloride represented by the formula $R^2\text{-}SO_2Cl$ wherein $R^2$ is as defined above, under a basic condition according to a method, for example, described in L. Bauer et al., J. Org. Chem., 24, 1293 (1959), etc.

The esters represented by the formula (I) can be used either independently or in the form of a mixture of two or more.

As the resin A1, preferable is partially alkyletherified poly(p-vinylphenol) which alkyletherification ratio is from 10 to 35 mole %. As the resin A2, preferable is that having alkyletherification ratio being from 5 to 30 mole %. The mixing ratio of resin A1 and A2 is determined according to the situation where they are used.

An alkali-soluble resin other than the resin A1 and A2 can be contained in resin (A) above-mentioned. Examples of the alkali-soluble resin other than the resin A1 and A2 include vinylphenol resin, isopropenylphenol resin, copolymer of vinylphenol and styrene (preferable molar ratio of the vinylphenol in the copolymer is 50% or more.), copolymer of isopropenylphenol and styrene (preferable molar ratio of the isopropenylphenol in the copolymer is 50% or more.), hydrogenated polyvinylphenol and the like. The mixing ratio of the alkali-soluble resin other than A1 and A2 to the resin A1 and A2 can be determined according to the situation where they are used, as long as the object of the present invention is attained.

Examples of the alkylether include straight chain and branched chain alkylether, among which those having 1 to 4 carbon atoms are preferable, and particularly preferable is methylether or ethylether. Preferable alkyletherification ratio of the resin A1 is from 15 to 22 mole % and that of the resin A2 is from 8 to 20 mole %.

The resin A1 can be produced by reacting a polyvinylphenol with an alkyl halide according to a method described in, for example, G. N. Vyas et al., Org. Syntheses Coll. Vol. IV, 836 (1963), etc. The resin A2 can be produced by reacting a hydrogenated polyvinylphenol with an alkyl halide according to a method described in, for example, above-mentioned G. N. Vyas et al., etc. The hydrogenated polyvinylphenol can be produced by a hydrogenation of a polyvinylphenol according to a usual method.

The alkali-soluble resins A1 and A2 usually have a weight average molecular weight of from 1,000 to 10,000 measured by GPC calculated as polystyrene, preferably from 1,500 to 8,000 and particularly preferably from 2,000 to 5,000.

Examples of the cross-linking agent include the compound having methylol group or methylol-ether group described in, for example, Japanese Patent Application No. 92-15009. As the preferable example, the following can be referred to:

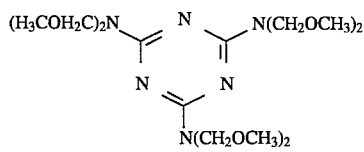

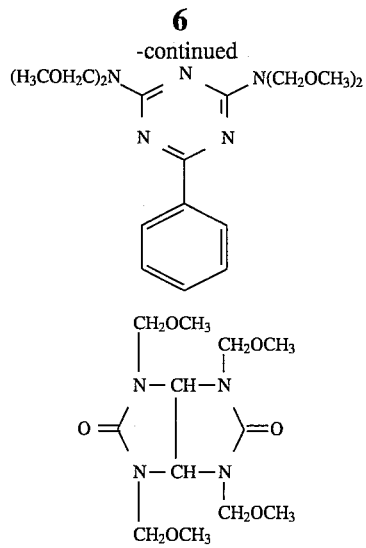

and the like.

The cross-linking agent having methylol group or methylol-ether group can be used either independently or in the form of a mixture of two or more.

Examples of the dissolution inhibitor include the compound having benzene ring substituted by t-butoxy-carbonyloxy group described in, for example, Japanese Patent Application No. 92-90771 and the cyclic carbonate-ester compound described in, for example, Japanese Patent Application No. 92-90770. Among these dissolution inhibitor, preferable examples are the following ones:

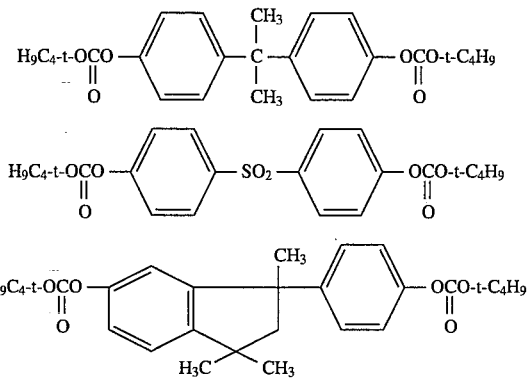

and the like.

The dissolution inhibitor can be used either independently or in the mixture of two or more.

In the negative photo resist composition, the mixing ratio of the ingredients is preferably as follows: alkali-soluble resin from 50 to 95% by weight, cross-linking agent from 1 to 30% by weight, photo induced acid precursor from 1 to 20% by weight.

In the positive photo resist composition, the mixing ratio of the ingredients is preferably as follows: alkali-soluble resin from 20 to 90% by weight, dissolution inhibitor from 5 to 50% by weight, photo induced acid precursor from 0.1 to 20% by weight.

Either to the negative photoresist composition or to the positive photoresist composition of the present invention, various additives conventionally used in this field of art, such as sensitizer, dye, adhesion improver and the like, may be added, if desired.

A photoresist solution is usually prepared by mixing the above-mentioned negative or positive photoresist composition into a solvent so that the concentration of the composition in the total mixture comes to 10 to 50% by weight. Examples of the solvent usable for this purpose include ethyl cellosolve acetate, methyl cellosolve acetate, ethyl cellosolve, methyl cellosolve, propyleneglycol monomethylether acetate, propyleneglycol monoethylether acetate, propyleneglycol monomethylether, propyleneglycol monoethylether, diethyleneglycol dimethylether, ethyl lactate, butyl acetate, ethyl pyruvate, 2-heptanone, cyclohexanone, methyl-isobutyl ketone, xylene and the like. These solvents can be used either independently or in combination of two or more.

The positive photoresist composition and the negative photoresist composition of the present invention are excellent in various properties such as heat resistance, film thickness retention, coatability, profile and the like. They further exhibit high sensitivity and high resolution when far ultraviolet rays including excimer laser is used as the light source. They also have the advantage that minute residue (scam) is hardly caused during the developing process, particularly when the alkali-soluble resin is A2. Accordingly, in the lithography using above-mentioned light source, the resolution and the contrast can be remarkably improved and highly precise fine photoresist pattern can be formed.

Next, the present invention will be explained in more detail with reference to the following examples. The present invention is by no means limited by these examples. In the examples, parts are by weight, unless otherwise referred to.

Referential Example 1

Into acetone, 10 g of polyvinylphenol (LYNCUR M; weight average molecular weight 4150; manufactured by Maruzen Petrochemical Co.) was dissolved, then 12.0 g of potassium carbonate and 3.38 g of ethyl iodide were added thereinto, and the resulting mixture was heated for 6 hours under refluxing. Thereafter, the reaction mixture was poured into mixed liquid of 600 ml of water and 350 ml of ethyl acetate, then hydrochloric acid was added thereinto to make the mixture in acidic condition, and concussion and extraction were carried out. The organic layer thus obtained was washed until the washings had reached neutrality, and then the solvent was distilled off. The residue thus obtained was dissolved into 25 ml of methanol and the resulting solution was poured into 1.3 L of water to cause deposition. The deposited product was collected by filtration, and dryed to obtain partially ethyletherified polyvinylphenol having the ethyletherification ratio of 18.8 mole %.

Referential Example 2–4

Referential Example 1 was repeated except 3.84 g, 3.90 g or 2.96 g of ethyl iodide was used instead of 3.38 g of ethyl iodide used in Referential Example 1 to obtain partially ethyletherified polyvinylphenol having the ethyletherification ratio of 20.3 mole %, 21.8 mole % or 16.7 mole %, respectively.

EXAMPLE 1

Into 48 parts of diethyleneglycol dimethylether, 13.5 parts of partially ethyletherifide polyvinylphenol obtained in Referential Example 1, 1.0 part of hexamethylolmelaminehexamethylether (cross-linking agent) and 1.0 part of N-hydroxysuccinimide methanesulfonicacid ester (photo-induced acid precursor) were dissolved. The resulting solution was filtered through a Teflon filter having a pore size of 0.1 μm to prepare a resist solution.

A silicon wafer washed in a conventional manner was coated with the resist solution thus prepared by mean of a spinner so as to give a coating thickness of 0.7 μm. Then the silicone wafer was prebaked on a hotplate at 100° C. for 1 minute. The prebaked coating film was exposed to light through a patterned chrome mask with KrF Excimer Laser Stepper (NSR-1755, EX8A, NA=0.45, manufactured by Nicon Co.) using 248 nm ultraviolet ray. After the exposure, the wafer was heated on a hot plate at 100° C. for 1 minute to cause cross-linking reaction at the exposed part. Thereafter, the wafer was developed with a 2.38% aqueous solution of tetramethylammonium hydroxide to form a negative pattern. Then, the pattern thus formed was observed by mean of electron microscope. The observation revealed that 0.25 μm of the fine line-and-space pattern could be resolved at the exposure dose of 42 mJ/cm$^2$ (248 nm, effective sensitivity) with a good profile and no scam was observed at the unexposed part.

EXAMPLE 2

Example 1 was repeated except that partially ethyletherifide polyvinylphenol obtained in Referential Example 2 was used instead of the partially ethyletherifide polyvinylphenol obtained in Referential Example 1 to obtain a negative pattern. The pattern thus formed was observed by mean of electron microscope and it was revealed that 0.25 μm of the line-and-space pattern could be resolved at the exposure dose of 25 mJ/cm$^2$ (248 nm).

EXAMPLE 3

Example 1 was repeated except that partially ethyletherifide polyvinylphenol obtained in Referential Example 3 was used instead of the partially ethyletherifide polyvinylphenol obtained in Referential Example 1 to obtain a negative pattern. The pattern thus formed was observed by mean of electron microscope and it was revealed that 0.25 μm of the line-and-space pattern could be resolved at the exposure dose of 20 mJ/cm$^2$ (248 nm).

EXAMPLE 4

Example 1 was repeated except that partially ethyletherifide polyvinylphenol obtained in Referential Example 4 was used instead of the partially ethyletherifide polyvinylphenol obtained in Referential Example 1 to obtain a negative pattern. The pattern thus formed was observed by mean of electron microscope and it was revealed that 0.25 μm of the line-and-space pattern could be resolved at the exposure dose of 29 mJ/cm$^2$ (248 nm).

EXAMPLE 5

Example 1 was repeated except that, as the alkali-soluble resin, the mixture of 8.1 parts of partially ethyletherifide polyvinylphenol obtained in Referential Example 2 and 5.4 parts of copolymer of vinylphenol and styrene (LYNCUR CST-70; weight average molecular weight 1720; molar ratio of vinylphenol to styrene is 70:30; manufactured by Maruzen Petrochemical Co.) was used instead of the partially ethyletherifide polyvinylphenol obtained in Referential Example 1 to obtain a negative pattern. The pattern thus formed was observed by mean of electron microscope and it was revealed that 0.25 μm of the line-and-space pattern could be resolved at the exposure dose of 27 mJ/cm$^2$ (248 nm).

Comparative Example 1

According to the same manner as in Example 1 except that 13.5 parts of polyvinylphenol was used instead of the partially ethyletherifide polyvinylphenol obtained in Referential Example 1, a resist solution was prepared.

A silicon wafer washed in the conventional manner was coated with the resist solution by mean of a spinner so as to give a coating thickness of 0.7 μm. Then the silicone wafer was prebaked on a hotplate at 100° C. for 1 minute. The prebaked coating film was exposed to light through a patterned chrome mask with KrF Excimer Laser Stepper (NSR-1755, EX8A, NA=0.45, manufactured by Nicon Co.) using 248 nm ultraviolet ray. After the exposure, the wafer was heated on a hot plate at 105° C. for 1 minute to cause cross-linking reaction at the exposed part. Thereafter, the wafer was developed with a 2.0% aqueous solution of tetramethylammonium hydroxide to form a negative pattern. Then, the pattern thus formed was observed by mean of electron microscope and it was revealed that only 0.35 μm of the line-and-space pattern could be resolved at the exposure dose of 50 mJ/cm$^2$ (248 nm).

Referential Example 5

Into acetone, 10 g of hydrogenated polyvinylphenol (LYNCUR PHM-C; weight average molecular weight 5400; manufactured by Maruzen Petrochemical Co.) was dissolved, then 12.0 g of potassium carbonate and 1.95 g of ethyl iodide were added thereinto, and the resulting mixture was heated for 6 hours under refluxing. Thereafter, the reaction mixture was poured into 2000 ml of pH 3 aqueous solution of acetic acid to cause deposition. Then, deposited resin was collected by filtration and dryed. The resin thus obtained was dissolved into acetone so that its concentration came to 20%. Then the resulting solution was mixed with hexane (the mixing ratio is 2:1 by weight), stirred for 1 hour at room temperature and left for a while.

Then the acetone layer was separated and poured into 2000 ml of ion exchanged water to cause deposition. The deposited product was collected by filtration, and dryed to obtain partially etheletherified hydrogenated polyvinylphenol having the ethyletherification ratio of 15 mole %.

Referential Example 6

Referential Example 5 was repeated except 1.56 g of ethyl iodide was used instead of 1.95 g of ethyl iodide to obtain partially hydrogenated ethyletherified polyvinylphenol having the etyletherification ratio of 12 mole %.

EXAMPLE 6

Into 48 parts of diethyleneglycol dimethylether, 13.5 parts of partially ethyletherifide hydrogenated polyvinylphenol obtained in Referential Example 5, 1.0 part of hexamethylolmelaminehexamethylether (cross-linking agent) and 1.0 part of N-hydroxysuccinimide methanesulfonicacid ester (photoinduced acid precursor) were dissolved. The resulting solution was filtered through a Teflon filter having a pore size of 0.1 μm to prepare a resist solution. A silicon wafer washed in a conventional manner was coated with the resist solution thus prepared by mean of a spinner so as to give a coating thickness of 0.7 μm. Then the silicone wafer was prebaked on a hot plate at 100° C. for 1 minute. The prebaked coating film was exposed to light through a patterned chrome mask with KrF Excimer Laser Stepper (NSR-1755, EX8A, NA=0.45, manufactured by Nicon Co.) using 248 nm ultraviolet ray. After the exposure, the wafer was heated on a hot plate at 100° C. for 1 minute to cause cross-linking reaction at the exposed part. Thereafter, the wafer was developed with a 2.38% aqueous solution of tetramethylammonium hydroxide to form a negative pattern. Then, the pattern thus formed was observed by mean of electron microscope. The observation revealed that 0.25 μm of the fine line-and-space pattern could be resolved at the exposure dose of 25 mJ/cm$^2$ (248 nm) with a good profile and no scam was observed at the unexposed part.

EXAMPLE 7

Into 60 parts of propyleneglycol monomethylether acetate, 6.75 parts of partially ethyletherifide hydrogenated polyvinylphenol obtained in Referential Example 5, 6.75 parts of partially ethyletherifide polyvinylphenol (ethyletherification ratio is 22%), 1.0 part of hexamethylolmelaminehexamethylether (crosslinking agent) and 0.75 part of N-hydroxysuccinimideethane sulfonicacid ester (photo-induced acid precursor) were dissolved. Thereafter, same processes as in Example 6 were conducted, except that the temperature for heating the wafer after the exposure was altered to 110° C., to form a negative pattern. Then, the pattern thus formed was observed by mean of electron microscope. The observation revealed that 0.25 μm of the fine line-and-space pattern could be resolved at the exposure dose of 13 mJ/cm$^2$ (248 nm) with a good profile and no scam was observed at the unexposed part.

EXAMPLE 8

Into 60 parts of propyleneglycol monomethylether acetate, 10.8 parts of partially ethyletherifide hydrogenated polyvinylphenol obtained in Referential Example 6, 2.7 parts of partially ethyletherifide polyvinylphenol (ethyletherification ratio is 22% ), 1.0 part of hexamethylolmelaminehexamethylether (cross-linking agent) and 0.75 part of N-hydroxysuccinimide ethanesulfonicacid ester (photo-induced acid precursor) were dissolved. Thereafter, same processes as in Example 7 were conducted to form a negative pattern. Then, the pattern thus formed was observed by mean of electron microscope. The observation revealed that 0.25 μm of the fine line-and-space pattern could be resolved at the exposure dose of 20 mJ/cm$^2$ (248 nm) with a good profile and no scam was observed at the unexposed part.

EXAMPLE 9

Into 50 parts of diethyleneglycol dimethylether, 9.45 parts of partially ethyletherifide polyvinylphenol obtained in Referential Example 1, 4.05 parts of polyvinylphenol in which 28% of its hydroxy group is substituted by tert-butoxycarbonyloxy group, 1.62 parts of the compound represented by the following formula (dissolution inhibitor);

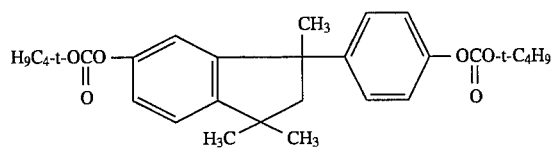

and 2.0 parts of N-hydroxysuccinimide propanesulfonicacid ester (photo-induced acid precursor) were dissolved. The resulting solution was filtered through a Teflon filter having a pore size of 0.1 μm to prepare a resist solution.

A silicon wafer washed in a conventional manner was coated with the resist solution thus prepared by mean of a spinner so as to give a coating thickness of 0.7 μm. Then the silicone wafer was prebaked on a hotplate at 100° C. for 1 minute. The prebaked coating film was exposed to light through a patterned chrome mask with KrF Excimer Laser Stepper (NSR-1755, EX8A, NA=0.45, manufactured by Nicon Co.) using 248 μm far ultraviolet ray as the exposure light. After the exposure, the wafer was heated on a hotplate at 80° C. for 1 minute and 30 seconds. Thereafter, the wafer was developed with a 2.38% aqueous solution of tetramethylammonium hydroxide to form a positive pattern. Then, the pattern thus formed was observed by mean of electron microscope. The observation revealed that 0.25 μm of the fine line-and-space pattern could be resolved at the exposure dose of 136 mJ/cm$^2$ (248 nm) with a good profile and no scam was observed at the exposed part.

What we claim are:

1. A negative photoresist composition which comprises:

(A) an alkali soluble resin containing at least one resin selected from the group consisting of a partially alkyletherified polyvinylphenol, wherein 10 to 35% of the phenol groups have had their hydroxy moiety alkyletherified, and a partially alkyletherified hydrogenated polyvinylphenol, wherein 5 to 30% of the phenol groups have had their hydroxy moiety alkyletherified;

(B) a photo-induced acid precursor containing at least a sulfonic acid ester of an N-hydroxyimide compound; and (C) crosslinking agent.

2. The photoresist composition according to claim 1, wherein the alkali soluble resin is a partially alkyletherified poly(p-vinylphenol) having alkyletherification ratio of from 10 to 35%.

3. The photoresist composition according to claim 1, wherein the alkali soluble resin is a partially alkyletherified hydrogenated polyvinylphenol having alkyletherification ratio of from 5 to 30%.

4. The photoresist composition according to claim 1, wherein the sulfonic acid ester of a N-hydroxyimide compound is a compound represented by the following formula (I):

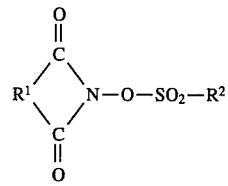

wherein R$^1$ is optionally substituted arylene, alkylene or alkenylene group and R$^2$ is optionally substituted alkyl or aryl group.

5. The photoresist composition according to claim 4, wherein R$^2$ is an optionally substituted alkyl or aryl group, said substituted alkyl or aryl group not being substituted with a fluorine atom.

6. The photoresist composition according to claim 1, wherein said alkali soluble resin (A) is present in an amount of from 50 to 95% by weight, said photo-induced acid precursor (B) is present in an amount of from 1 to 20% by weight, and said crosslinking agent (C) is present in an amount of from 1 to 30% by weight.

7. The photoresist composition according to claim 4, wherein R$^1$ is phenylene or naphthalene substituted with a member selected from the group consisting of halogen, nitro and acetylamino substituents.

8. The photoresist composition according to claim 4, wherein R$^1$ is an unsubstituted or substituted straight or branched chain alkylene group having 1 to 6 carbon atoms, wherein said substituted alkylene group is substituted with a member selected from the group consisting of halogen, lower alkoxy and monocyclic aryl substituents.

9. The photoresist composition according to claim 1, wherein the partially alkyletherified polyvinylphenol has an alkyletherification ratio of from 15 to 22 mole %, and partially alkyletherified hydrogenated polyvinylphenol has an alkyletherification ratio of from 8 to 20 mole %.

10. The photoresist composition according to claim 1, wherein said partially alkyletherified polyvinylphenol and said partially alkyletherified hydrogenated polyvinylphenol are formed by reacting a polyvinylphenol with an alkyl halide.

* * * * *